US 6,613,974 B2

(12) United States Patent
Husher

(10) Patent No.: US 6,613,974 B2
(45) Date of Patent: Sep. 2, 2003

(54) TANDEM SI-GE SOLAR CELL WITH IMPROVED CONVERSION EFFICIENCY

(75) Inventor: John Durbin Husher, Los Altos Hills, CA (US)

(73) Assignee: Micrel, Incorporated, San Jose, CA (US)

( * ) Notice: Subject to any disclaimer, the term of this patent is extended or adjusted under 35 U.S.C. 154(b) by 0 days.

(21) Appl. No.: 10/029,205

(22) Filed: Dec. 21, 2001

(65) Prior Publication Data

US 2003/0116187 A1 Jun. 26, 2003

(51) Int. Cl.[7] ............. H01L 31/06; H01L 31/18
(52) U.S. Cl. ............. 136/255; 136/261; 136/252; 136/249; 136/246; 136/259; 257/436; 257/461; 257/443; 438/71; 438/73; 438/74; 438/57; 438/526; 438/548; 438/559
(58) Field of Search ............. 136/255, 261, 136/252, 249, 246, 259; 257/436, 461, 443; 438/71, 73, 74, 57, 526, 548, 559

(56) References Cited

U.S. PATENT DOCUMENTS

| 4,451,838 A | * | 5/1984 | Yamazaki | 136/258 |
| 5,179,432 A | * | 1/1993 | Husher | 257/593 |
| 5,641,362 A | * | 6/1997 | Meier | 136/256 |
| 5,961,742 A | * | 10/1999 | Tange et al. | 136/256 |
| 5,973,260 A | * | 10/1999 | Tange et al. | 136/256 |

FOREIGN PATENT DOCUMENTS

EP    1094521 A2 * 4/2001

OTHER PUBLICATIONS

Cheng, "Epitaxial Growth," www.mrw.interscience.wiley.com, published in 1999–2000.*

* cited by examiner

*Primary Examiner*—Alan Diamond
(74) *Attorney, Agent, or Firm*—Dorsey & Whitney LLP; Edward N. Bachand; Michael A. Kaufman

(57) ABSTRACT

P-type and n-type regions are defined in the first surface of a substrate upon which is formed an epitaxial layer of preferably Si—Ge material, preferably capped by Si material. During epitaxy formation, dopant in the defined regions diffuses down to form p-type and n-type junctions in the Si material, and diffuses up to form p-type and n-type junctions in the Si—Ge epitaxial material. Si junctions are buried beneath the surface and are surface recombination velocity effects are reduced. Photon energy striking the second substrate surface generates electron-hole pairs that experience the high bandgap of the Si materials and the low bandgap of the Si—Ge epitaxy. The tandem structure absorbs photon energy from about 0.6 eV to about 3.5 eV and exhibits high conversion efficiency.

31 Claims, 3 Drawing Sheets

TANDEM SI-GE SOLAR CELL WITH IMPROVED CONVERSION EFFICIENCY

FIELD OF THE INVENTION

The invention relates generally to solar cells for converting solar energy to electrical energy, and more particularly to improving efficiency of solar cells.

BACKGROUND OF THE INVENTION

The demand for electrical energy continues to grow, yet the cost of producing such energy, especially by burning fossil fuels, seems to grow even faster. Generating electricity from solar energy using solar cells has for many years loomed on the horizon as a seemingly inexhaustible method for obtaining electricity, without attendant pollution. However the relatively low efficiency by which prior art solar cells convert solar energy to electricity has yet to be satisfactorily overcome. Solar-to-electrical energy conversion efficiency is on the order of about 15% for consumer grade solar cells, and is slightly higher for military grade solar cells used in outer space, which cells often employ a complex 3/5 compound substrate material to try to boost conversion efficiency.

Solar cells absorb photons from light energy, e.g., energy from the sun, and generate an electrical voltage and/or current in response. The incoming photon energy releases electron and hole pairs within a semiconductor substrate bulk that typically is silicon material. The solar cell structure includes one or more semiconductor p-n junctions whose internal electric fields help separate holes and electrons generated by the photon energy. The solar cell includes two terminals from which solar cell-generated voltage and/or current may be provided.

FIG. 1 depicts a typical prior art solar cell 10. Exemplary cell 10 is commonly fabricated on a semiconductor substrate (or bulk) 20 that is typically high resistivity long lifetime n-type silicon having a light receiving surface 30 and a second surface 40. Si is used more commonly than Ge in fabricating solar cells because the open circuit voltage (Voc) for Si is about 0.6 V whereas Voc for Ge is only about 0.2 V. Further, solar cells tends to get hot (even when used indoors), and Si can operate at higher temperatures than Ge.

In FIG. 1, a plurality of n-type regions 50-N and p-type regions 50-P is formed adjacent second surface 40. Using convention fabrication techniques, the upper surface 40 of the structure will be masked (mask not shown) and implants of n-type dopants made into what will be regions 50-N, and implants of p-type dopant into what will be regions 50-P. Next, the dopants are diffused into the substrate material, typically by application of thermal energy. Given that substrate 20 is n-type material, p-n diode junctions are formed at the interface of p-type regions 50-N with the surrounding n-type substrate material 20. Although not required for solar conversion, cell 10 is shown with a cavity 60 formed in light-receiving surface 30. Cavity surface 70 may be formed with a conditioned surface that may include surface passivation, anti-reflection coating(s), and perhaps lens structures.

In practice, metal interconnections (not shown) will be made on surface 40, which interconnections block some of the incoming light. Accordingly it is preferred that cavity 60 be formed to allow light to penetrate surface 70 without blockage from metal interconnections on surface 40. Further, concentration of dopants is higher in regions near at surface 40 than in regions near surface 70. Regions near surface 40 will therefore characterized by shorter recombination lifetimes than regions at the junction depths where photon energy from light that enters the structure from the cavity direction generates electron-hole pairs.

In the configuration shown in FIG. 1, when cavity surface 70 is exposed to incoming light, the associated photon energy can release electron-hole pairs (denoted by "-" and "o" symbols) within substrate 20. Some electron-hole pairs will recombine in the depletion region associated with the various p-n diodes. Other electron-hole pairs can diffuse into these depletion regions where they will recombine. A high percentage of electron-hole pairs will recombine in the substrate bulk without contributing to the generation of voltage or current signals.

The intrinsic electric field associated with the p-n regions (e.g., diode regions) produces a drift in the recombination, and produces an electrical current. This current is collected by metal or other conductive electrode structures (not shown) on surface 40 of solar cell 10, which electrodes are coupled to the p-junctions or to the n-junctions.

Conversion loss or inefficiency can result from electron-hole recombination that occurs before the hole-electron pairs can move to the junction depletion regions and contribute to the drift current. This loss can be especially troublesome at high energy, shorter wavelength regions and results in reduced conversion efficiency and decreased effective output voltage and/or current from the solar cell.

Conversion efficiency of solar cells is also affected by the wavelength of the incoming solar energy, and by the absorption coefficient of the materials comprising the solar cell. FIG. 2 depicts the absorption coefficient as a function of photon energy for Ge, Si, and GaAs. The data shown in FIG. 2 was obtained by Dash and Newman, et al. and the figure itself was originally published by John Wiley (c) 1981. Note that the absorption coefficient per centimeter versus photon energy varies from Ge to Si to GaAs.

In general, Ge absorption is about one to two orders of magnitude better than Si, which is strong at photon energy levels from about 1.1 eV to about 3.5 eV. Note that at low energy levels of about 0.6 eV (long wavelengths), Si has poor absorption but Ge exhibits good absorption. In essence, the bandgap for Ge and Si determine the cutoff of the longer wavelengths, with little or no absorption where the photon energy is less than the bandgap. Thus, long wavelengths resulting in energy less than about 1.1 eV will not be absorbed or captured by Si, while wavelengths that result in less than about 0.6 eV will not be absorbed by Ge. In this respect, Ge can capture wavelengths from 0.6 eV to 1.1 eV, wavelengths that Si cannot capture. The cutoff for high energy, short wavelengths is due to hole-electron pairs generated near the material surface. These hole-electron pairs are limited by surface recombination velocity and shorter lifetimes due to a higher dopant concentration. Photons end up recombining before they can reach the depletion regions. Such recombination occurs at wavelengths that are short at energies of about 3.0 eV to about 3.5 eV and above, for Si and for Ge, and likely for SiGe as well.

Thus, there is a need for a solar cell that exhibits improved adsorption characteristics and improved conversion efficiency. Preferably such solar cell structure should include materials whose band gap is similar to Ge but whose Voc is similar to Si. Preferably such materials should exhibit high temperature characteristics similar to Si rather than to Ge.

The present invention provides such a solar cell.

SUMMARY OF THE INVENTION

A highly efficient solar cell includes a preferably high resistivity long-lifetime n-type Si substrate having a light receiving first surface that preferably defines a cavity, and an opposite second surface upon which electrical contacts may be formed. Incoming photon energy enters the solar cell via the light receiving first surface in the cavity region and frees electron-hole pairs within the solar cell structure. The structure of the present invention improves collection of such free charges, which improves conversion efficiency of the overall solar cell structure.

Si material absorbs and can convert photon energy from about 1.1 eV to about 3.5 eV, but is less efficient at lower energy levels. By contrast, Ge material can absorb and convert photon energy below 1.1 eV down to about 0.6 eV. The present invention combines aspects of both materials to provide a tandem solar cell that can absorb and convert photon energy from about 0.6 eV to about 3.5 eV. The tandem solar cell exhibits the open circuit voltage Voc for Si of about 0.6 V, and further exhibits the large short circuit current associated with Si.

During fabrication, alternating n-type and p-type regions are defined and implanted adjacent the second surface without immediately being diffused. This process step is preferably immediately followed with formation of an epitaxial layer of Si—Ge, followed immediately by a growth of silicon epitaxy to cap the S—Ge material. Advantageously the epitaxial cap can reduce stress generated by the physical mismatch between the small size of Si atoms and the larger size of germanium atoms. Further, the Si—Ge region and overlying Si cap region provides additional material that helps bury the Si—Ge junction region from the new surface formed by the Si epitaxial cap.

Heat introduced during growth of the epitaxial layers produces diffusion of dopants previously implanted in the substrate material. As a result of this heat regime, some dopant diffuses downward into the Si bulk toward the first surface, and some dopant diffuses upward into the Si—Ge epitaxial layer region and into the overlying Si epitaxial cap region. Advantageously, p-type and n-type diode regions formed in the Si substrate are not at the surface of the structure, and surface recombination of electron-hole pairs generated from incoming photon energy is reduced. Further, numerous depletion regions are defined in the Si bulk, in the Si—Ge epitaxial layer, and even within the overlying Si epitaxial cap layer.

Junctions in the Si substrate and the junctions in the Si—Ge epitaxial layer exhibit different energy bandgaps and different characteristics in response to the wavelength of photon energy entering the solar cell. A tandem solar cell according to the present invention combines in series the bandgap characteristics of Si and Si—Ge with incoming photon energy first being exposed to the higher Si bandgap and then to the lower Si—Ge bandgap. The result is good absorption and energy conversion from 0.6 eV through 3.5 eV. Overall conversion efficiency, is improved, and can be as high as about 50% to 60%.

Other features and advantages of the invention will appear from the following description in which the preferred embodiments have been set forth in detail in conjunction with the accompanying drawings.

DETAILED DESCRIPTION OF THE PREFERRED EMBODIMENTS

The present invention provides a Si, Si—Ge, Si tandem structure solar cell that advantageously exhibits the high 0.6 Voc and improved high temperature operation of Si, and is adequately responsive over an energy range of about 0.6 eV to about 3.5 eV. The use of Si—Ge material advantageously implements a solar cell that responds better over shorter wavelengths and longer wavelengths than could Si or Ge material alone.

The present invention recognizes that one limiting factor to solar cell conversion efficiency results from-surface recombination velocity. Surface recombination velocity is especially troublesome for high energy, short wavelength photon energy. A hypothetical demarcation line 110 is a convenient reference for discerning changes between prior art solar cell 10 and a tandem solar cell 100, according to the present invention.

Figure 1:
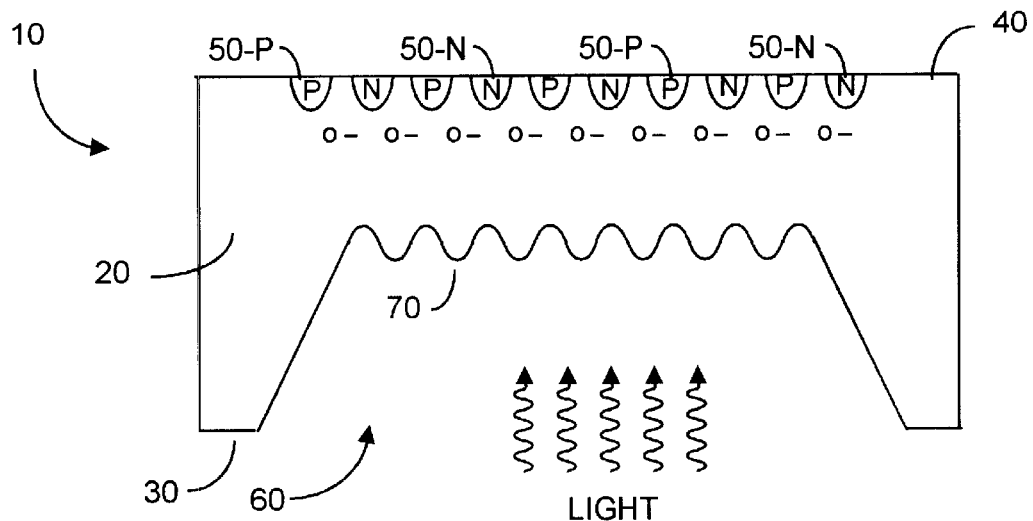
FIG. 1 depicts a generic solar cell, according to the prior art.
Figure 3:
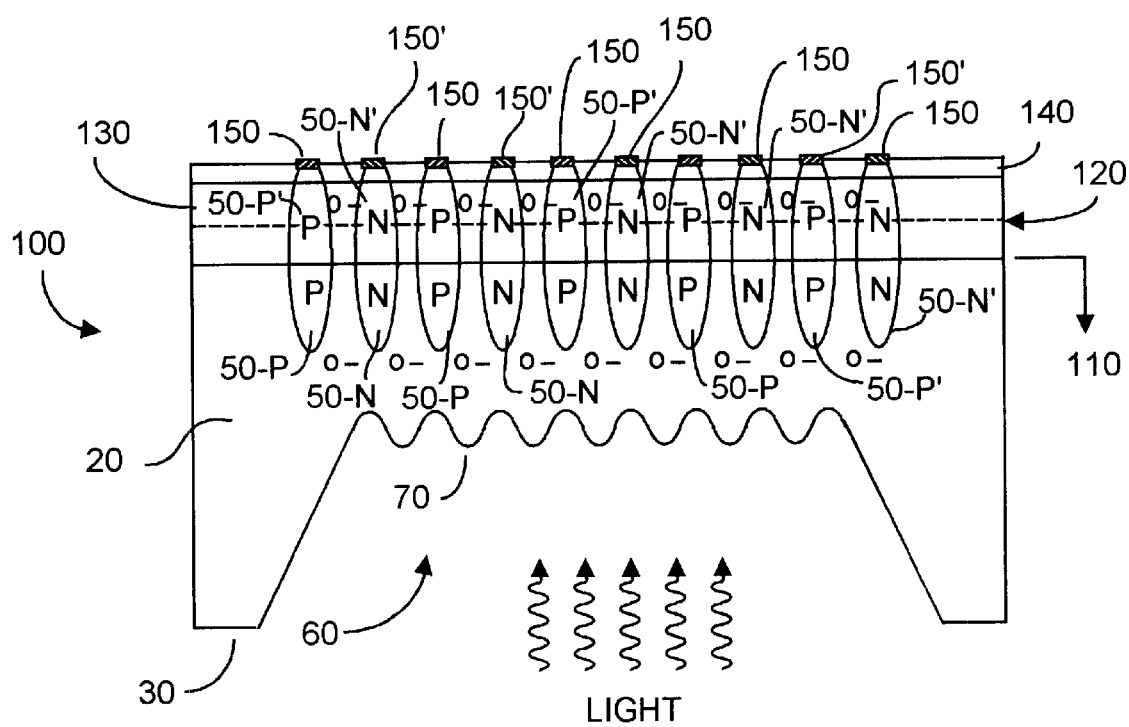
FIG. 3 depicts an embodiment of a tandem Si—Ge solar cell with improved conversion efficiency, according to the present invention.

As shown by FIG. 3, from hypothetical demarcation line 110 downward, solar cell 100 according to the present invention is similar to the prior art cell shown in FIG. 1. However upward of demarcation line 110, the structure is rather different. In FIG. 3, reference numerals that are the same as those used in FIG. 1 can refer to identical elements as those described in FIG. 1. In cell 100, substrate 20 is again preferably a p-type Si material.

Assume in FIG. 3 that p-type dopant has been implanted but not yet diffused into what will be regions 50-P, and that n-type dopant has been implanted but not yet diffused into what will be regions 50-N. At this juncture in the fabrication process, rather than apply heat to diffuse the p-type and n-type dopants into substrate 20, diffusion is deferred. Instead of diffusion, the next process step is to grow a thin Si—Ge epitaxial layer 130 to a thickness of perhaps a few hundred Å to perhaps a thousand Å, and preferably immediately to grow a so-called epitaxial cap layer 140 of Si material to a thickness of perhaps a hundred Å. Preferably layers 130 and 140 are formed simultaneously, immediately after formation of the underlying structure. Layers 130 and 140 preferably use a high resistivity p-type or n-type material that has a long lifetime.

Ge atoms are substantially larger than Si atoms. Si cap layer 140 advantageously reduces mismatch and the resultant stress arising from the different sizes of the small Si atoms and the larger Ge atoms. Exemplary levels of doping for this epitaxial layer are about $1 \cdot 10^{16}/cm^3$. It will be recalled that p-dopant and n-dopant was previously implanted into the Si bulk region 120, and it is thermal energy associated with formation of epitaxial layers 130 and 140 that now diffuses these dopants. P-type and n-type dopants diffuse downward into substrate 20, and advantageously also diffuse upward toward and into epitaxial layers 130, 140.

Figure 4A:
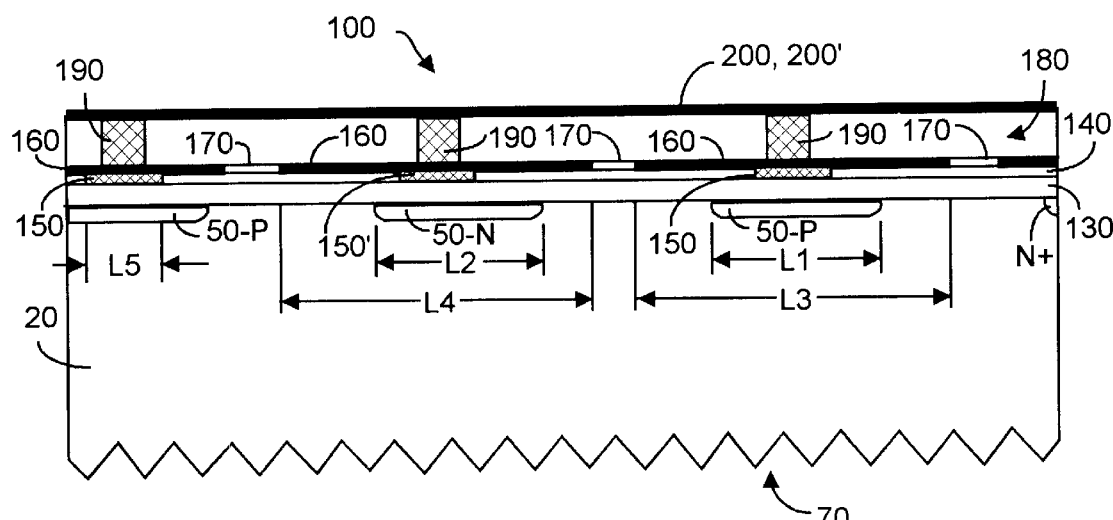
FIG. 4A is a more detailed cross-section of an embodiment of a tandem Si—Ge solar cell showing electrically conductive interconnects to the n-type and p-type junctions formed in the Si substrate, according to the present invention.
Figure 4B:
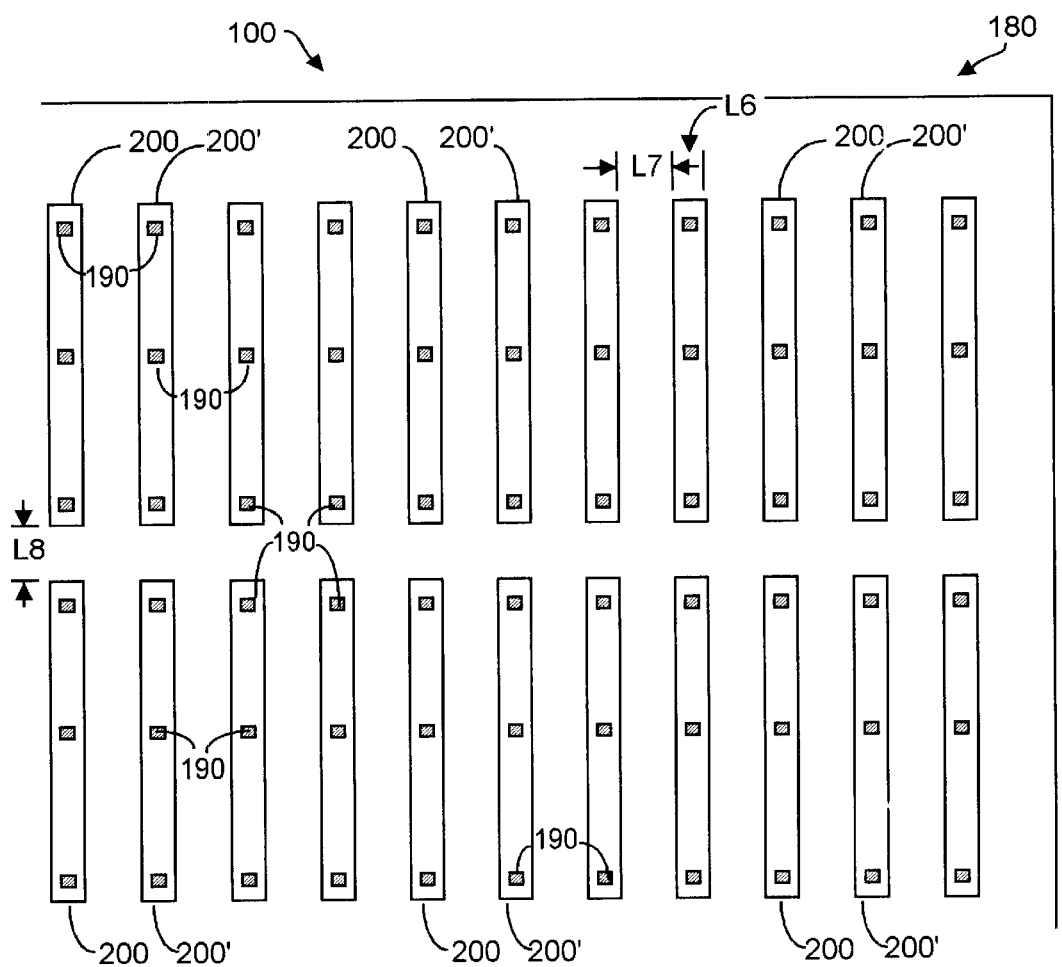
FIG. 4B is a plan view showing a conductive interconnect layer for making electrical contact with n-type and p-type regions formed in the Si—Ge solar cell shown in FIG. 4A, according to the present invention.

As structure 100 leaves the epitaxial reactor used to create layers 130, 140, the structure will have an uppermost cap layer 140 of epitaxial Si, an underlying Si—Ge epitaxial layer 130, and a Si bulk 20. In subsequent processing steps, conductive interconnects 150, 150' are formed at least partially into the Si epitaxial layer 140 overlying the implanted diffused doping regions. For example, conductive interconnects 150 are formed over the P-doped regions 50-P', and other conductive interconnects 150' are formed over the N-doped regions 50-N'. As seen in FIGS. 4A and 4B, the various conductive interconnects 150 are electrically connected to each other by overlying conductive elements 200, and the various conductive interconnects 150' are electrically connected to each other by overlying conductive elements 200'.

The upwardly diffused portions of the p-type regions are denoted 50-P' and the upwardly diffused portions of the n-type regions are denoted 50-N'. Thus, there will be p-type junctions (e.g., 50-P') and n-type junctions (e.g., 50-N') formed in the p-type Si—Ge epitaxial layer and well as p-type junctions (e.g., 50-P) and n-type junctions (e.g., 50-N) formed in the high resistivity p-type or n-type silicon substrate or bulk 20. Stated differently, whereas prior art cell 10 was formed with p-n junctions near the upper surface of the n-type substrate, tandem cell 100 forms p-n junctions within substrate 20, as well as p-n junctions within the p-type Si—Ge epitaxial layer 130 and even the Si cap layer 140.

As shown by FIG. 3, pairs of electrons (denoted "-") and holes (denoted "o") generated by incoming photon or light energy ("LIGHT") will be present above and below demarcation line 120. In the prior art cell 10 shown in FIG. 1, electron-hole pairs created by incoming photon energy were absorbed or collected only in the p-n junctions present in the depletion regions in the Si substrate. But in tandem solar cell 100 shown in FIG. 3, in addition to collection in the p-n junctions present in such depletion region in substrate 20, photon energy freed charges can also be collected in the p-n regions formed in Si—Ge epitaxial layer 130, and even within the Si cap region 140. Advantageously more electron-hole pairs are absorbed by the tandem-fabricated structure shown in FIG. 3 than will be collected by the prior art structure shown in FIG. 1, for the same magnitude and wavelength of incoming photon energy. Stated differently, tandem cell 100 operates more efficiently to convert solar energy to output current or voltage than prior art cell 10.

Thus in FIG. 3, many p-n junctions now are formed within the bulk of Si substrate 20 rather than only adjacent the surface (as in prior art FIG. 1) 30 where surface recombination velocity effects tend to reduce conversion efficiency. Thus, referring still to FIG. 3, it will be appreciated that many electron-hole pairs are now generated near substrate bulk regions that do not exhibit high dopant concentration, and low lifetimes.

The structure of FIG. 3 provides multiple energy response bands in that incoming photon energy ("LIGHT") first affects portions of the Si substrate and then affects portions of the Si—Ge epitaxial layer. In essence, tandem solar cell 100 combines in series (but in effect, parallel-combines) the bandgap associated with Si substrate 20 and the bandgap associated with the Si—Ge epitaxial layer 130 and with the Si epitaxial layer 140. Incoming photon energy first affects the Si substrate bandgap associated with bulk 20. The Si material is characterized by a higher bandgap (e.g. about 1.1 eV) than the Si—Ge bandgap (e.g., about 0.6 eV) and can pass longer wavelength lower energy levels. In practice, energy levels exceeding about 1.1 eV can be absorbed by both the Si substrate material 20 and by the Si—Ge epitaxial layer material 130.

Thus photon energy entering cell 100 through bottom region 70 (in the configuration shown) generates electron-hole pairs characterized by lower energy, longer wavelength photons. These photons pass through the Si junctions first, e.g., junctions extending downward into the Si bulk 20, which Si junctions have a relatively large bandgap (e.g., about 1.1 eV).

Figure 2:
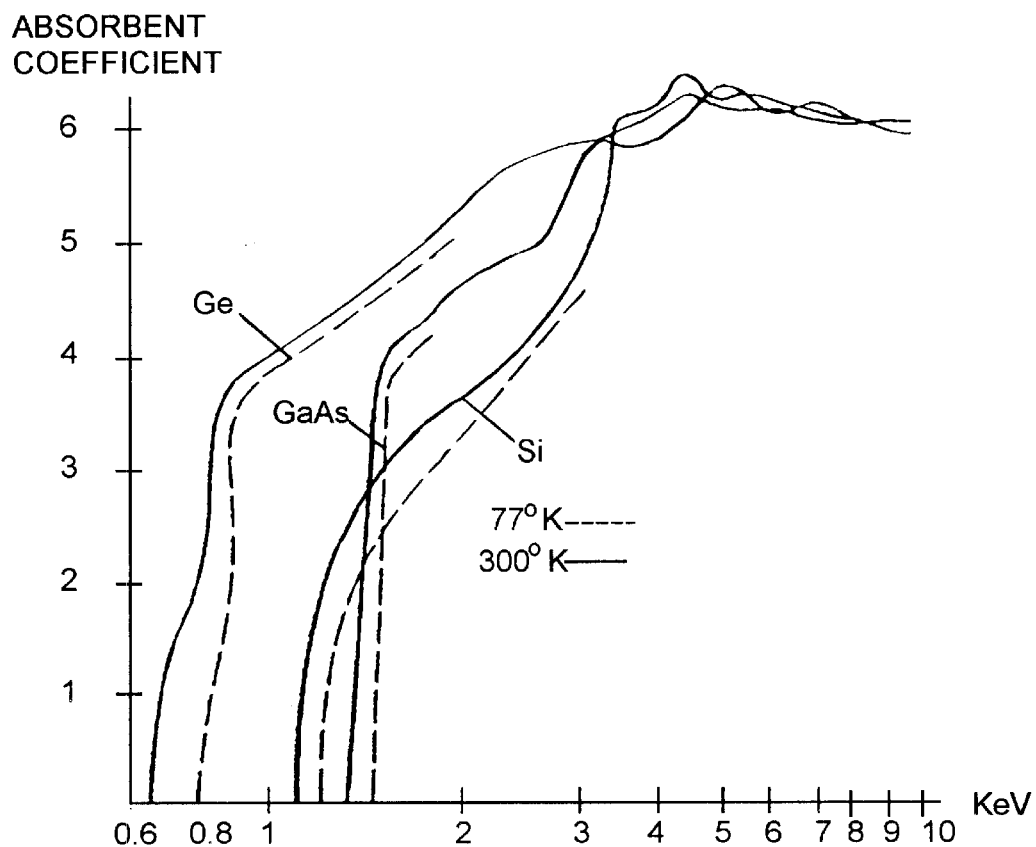
FIG. 2 depicts absorption coefficients as a function of photon energy for Ge, Si, and GaAs materials, according to the prior art.

These photons provide a window for electron-hole pairs to then fall upon the Si—Ge junctions (e.g., junctions extending upwardly into the Si—Ge epitaxial layer 120), which junctions are characterized by a lower bandgap and longer wavelengths of energy (e.g., 0.6 eV). In essence, this window provides the source for electron-hole pair recombination in the Si—Ge epitaxial layer for longer wavelengths of energy (e.g., 0.6 eV) as well as for higher levels of energy, extending to about 3.5 eV (see FIG. 2). Photons whose energy level is in a higher range of about 1.1 eV to about 3.5 eV generate electron-hole pairs in the depletion regions for the P and N diodes formed in the Si substrate bulk 20, for the Si bandgap and absorption coefficient, as well as for upper levels of photon energy that Ge within epitaxial layer 130 can absorb. The electron-hole pairs generated via the Si bandgap and via the Si—Ge bandgap are additive and yield a higher open circuit voltage Voc of about 0.6 V, and a higher short circuit current.

A further benefit of the tandem construction shown in FIG. 3 is that the Si junctions are now buried within the Si bulk rather than existing on an interface between a surface of the Si bulk and an $SiO_2$ layer. As a result, the ill effects of surface recombination upon conversion efficiency are substantially reduced, especially at higher.energy or frequency photon levels. Advantageously, the present invention enables higher energy photons to generate electron-hole pairs that do not so readily recombine before entering the depletion region and contributing to desired output signal current or voltage. In essence, electron-hole pairs that are generated with a photon energy level of about 3.0 eV to 4.0 eV are now absorbed and contribute to the output signal, in stark contrast to prior art solar cell configurations. Overall, a tandem-arrangement of Si material and Si—Ge material according to the present invention can achieve conversion efficiencies up to about 60% (using-focused light), as contrasted with perhaps 15% to 20% for the more efficient types of prior art solar cells. As noted, this improved performance results from improved efficiency of the Si junctions (due to reduced surface loss), from the additional depletion regions formed in the Si—Ge junctions, and from solar cell response to a wide regime of energies spanning about 0.6 eV to 3.0 eV rather than being limited to the more restricted range of energies to which Si can respond.

FIG. 4A depicts a more detailed cross-section of a portion of a tandem Si—Ge solar cell 100, showing details of electrically conductive interconnects to the n-type and p-type junctions formed in the Si substrate, while FIG. 4B depicts electrically interconnects for connections overlying n-type and p-type junctions formed in the Si substrate.

FIG. 4A depicts solar cell 100 showing portions of some p-type regions 50-P and some n-type regions 50-N formed in the preferably high resistivity n-type Si substrate 20. In one embodiment, the typical width of a p-type region is $L1 \approx 12$ μm, where the region is formed using a diffusion of Boron process. The typical width of an n-type region is $L2 \approx 12$ μm, where the region is formed using a diffusion of phosphorous. Other dimensions could of course be used, and some regions could be sized differently than other regions, if desired.

As noted above, electrically conductive regions 150, 150' are formed at least partially into the Si cap layer 140, overlying respective p-type and n-type regions formed in the Si substrate. Using conventional fabrication techniques, a first layer of conductive material 160 (e.g., first layer metal) is defined over portions of the cap layer to make electrical contact with various 150, 150' conductive regions. Gaps 170 of perhaps 4 µm width are formed between otherwise adjacent segments of first level metal 160. Preferably a layer 190 of PSG material is provided, and regions of the PSG (or equivalent) material are exposed to permit depositing or otherwise providing conductive regions 190.

Next a second layer of metal is provided and defined to define segments 200 and 200'. As best seen in FIG. 4B, various segments 200, 200' of the second layer metal are interconnected such that electrical communication is provided downward from segments 200 to groups of p-type regions 50-P, and is provided downward from segments 200' to n-type regions 50-N formed in the Si substrate 20. An overlying layer of field oxide (not shown), perhaps 1,500 Å thick, forms and protects the upper surface of cell 100.

Referring now to FIG. 4B, as described above, upper or second metal layer is defined to form a pattern of conductive traces 200, 200' that are in downward electrical communication with underlying conductive regions 190. Conductive regions 190, in turn, are in electrical communication with segments of the defined first metal layer 160. As seen in FIG. 4A, first metal segments 160 are in communication with conductive regions 150, 150' formed at least partially through the Si cap layer 140. Conductive regions 150 provide electrical communication to underlying p-type regions 50-p in the Si bulk, while conductive regions 150' provide electrical communication to underlying n-type regions 50-n in the Si bulk.

In FIG. 4B, regions 190 are about 6 µm×6 µm in size, although other dimensions could be used. Metal two traces 200, 200' preferably have a trace width L6 of perhaps 12 µm, and a spaced-apart pitch L7 of perhaps 18 µm, although other dimensions may of course be used. In FIG. 4B, each trace 200, 200' is depicted in electrically communication with three underlying conductive regions 190. Of course fewer or more than three such contacts could be enabled with a single trace, depending up pitches and dimensions used. In FIG. 4B, exemplary trace row gap distance L8 is perhaps 20 µm, although a different separation gap distance could of course be used.

As noted, FIGS. 4A and 4B depict primarily a preferred embodiment to implement electrical contact from traces 200 and 200' with junctions formed in the Si substrate. Signal leads (or the equivalent) that provide an output signal from tandem cell 100 will be in electrical communication with traces 200 and with traces 200'.

To recapitulate, from FIG. 3 the upwardly diffused p-type and n-type junctions extend into the Si—Ge epitaxial layer 130 and into the Si cap layer 140. It will be appreciated that a process similar to that described with reference to FIGS. 4A and 4B could be carried out to make electrical contact with the p-type and n-type junctions extending upwardly into the epitaxial layer. If these junctions did not extend upwardly sufficiently far, when defining contact regions, e.g., by etching, further implant may be carried out to improve conductivity to the overlying contacts and traces that will be formed.

Applicant points out that preferably metal alloying is carried out in a hydrogen gas environment, or that gas is formed after the first layer of metalization to provide an Alneal in which fast surface states are reduced if not eliminated.

Those-skilled in the art will appreciate that there is some potential that the Si—Ge epitaxial layer may be subjected to stress by virtue of the relatively large Ge atom within the crystal structure. Applicant has not yet field tested to determine whether such stress is present, and if present whether a meaningful decrease in solar cell lifetime results. However it is believed that the high conversion efficiency advantages, high Voc and high short circuit current provided by the present invention outweigh any reduction in solar cell lifetime, if in fact such reduction even occurs.

As noted, a silicon cap layer may be included to promote stress relief as well as conversion efficiency of the solar cell. If desired, such cap layer could be fabricated with increased thickness to provide additional volume for depletion region conversion of electron-hole pairs, which additional volume would further promote solar cell current. One could be able to add further layers of Si—Ge and Si material through the epitaxial process to provide even greater volume of depletion regions.

If however it were desired to provide against this possibility, epitaxial layer 130 could be fabricated from Si epitaxy rather than from Si—Ge. The resultant structure would still provide buried (rather than surface level) Si substrate junctions, and would provide enhanced junction depletion, about twice that available from a structure using Si—Ge epitaxy. However the ability of Ge material to absorb long wave photon energy (0.6 eV) would not be present. Note too that one should be able to continue the process and create n-type and p-type junctions solely within the epitaxial layer (Si—Ge or other epitaxy material). Such construction would provide even more depletion layers than the single tandem structure shown in FIG. 3, and should provide even greater conversion efficiency.

It will be appreciated the dopant types described herein could be replaced by opposite dopant types. Thus, a p-type substrate solar cell could be fabricated rather than the n-type described.

Modifications and variations may be made to the disclosed embodiments without departing from the subject and spirit of the invention as defined by the following claims.

What is claimed is:

1. A method of forming a solar cell, comprising the following steps:
    (a) providing a substrate having a first light-receiving surface and a second surface;
    (b) forming in said substrate, adjacent said second surface, regions of n-type dopant and regions of p-type dopant; and
    (c) forming over said second surface a layer of epitaxial material, said epitaxial material having a bandgap smaller than a bandgap of said substrate;
    wherein formation of said layer of epitaxial material produces diffusion of said n-type dopant and said p-type dopant upward into said layer of epitaxial material and downward into said substrate.

2. The method of claim 1, wherein step (a) includes providing a Si substrate having a bandgap of about 1.1 eV.

3. The method of claim 2, wherein step (a) includes providing high resistivity n-type Si for said substrate.

4. The method of claim 1, wherein step (b) includes diffusing at least one dopant selected from phosphorus and boron.

5. The method of claim 1, wherein step (c) includes forming a Si—Ge epitaxial layer having a bandgap of about 0.6 eV.

6. The method of claim 1, wherein step (c) is carried out in a single fabrication step that includes forming said layer of epitaxial material as a Si—Ge epitaxial layer and further includes forming a cap layer of Si material substantially over said Si—Ge epitaxial layer.

7. The method of claim 1, wherein during use of said solar cell, photon energy entering said first light-receiving surface of said substrate generates electrical current that is collectable from junctions formed from at least one of (i) junctions formed in said substrate and (ii) junctions formed in said layer of epitaxial material.

8. The method of claim 1, wherein during use of said solar cell, photon energy entering said first light-receiving surface of said substrate generates electrical current that is collectable from junctions formed in said substrate and from junctions formed in said layer of epitaxial material.

9. The method of claim 1, wherein step (c) includes forming said layer of epitaxial material from Si.

10. The method of claim 1, wherein said solar cell exhibits on open circuit Voc of about 0.6 V.

11. The method of claim 1, wherein said solar cell absorbs substantial photon energy over a range of about 0.6 eV to at least 1.1 eV.

12. The method of claim 1, wherein said solar cell absorbs substantial photon energy over a range of about 0.6 eV to about 3.5 eV.

13. A method of forming a solar cell, comprising the following steps:
(a) providing an n-type Si substrate having a first light-receiving surface and a second surface;
(b) forming in said substrate, adjacent said second surface, regions of n-type dopant and regions of p-type dopant; and
(c) forming over said second surface a layer of Si—Ge epitaxial material such that forming said layer diffuses said n-type dopant and said p-type dopant into said layer of epitaxial material and into said substrate.

14. The method of claim 13, wherein step (a) includes providing a Si substrate having a bandgap of about 1.1 eV.

15. The method of claim 13, wherein step (b) includes diffusing at least one dopant selected from phosphorus and boron.

16. The method of claim 13, wherein step (c) is carried out in a single fabrication step that also includes forming a cap layer of Si material over said layer of Si—Ge epitaxial material.

17. The method of claim 13, wherein during use of said solar cell, photon energy entering said first light-receiving surface of said substrate generates electrical current that is collectible from junctions formed from at least one of (i) junctions formed in said substrate and (ii) junctions formed in said layer of epitaxial material.

18. The method of claim 13, wherein during use of said solar cell, photon energy entering said first light-receiving surface of said substrate generates electrical current that is collectible from junctions formed in said substrate and from junctions formed in said layer of epitaxial material.

19. The method of claim 13, wherein said solar cell exhibits on open circuit Voc of about 0.6 V.

20. The method of claim 13, wherein said solar cell absorbs substantial photon energy over a range of about 0.6 eV to at least 1.1 eV.

21. The method of claim 13, wherein said solar cell absorbs substantial photon energy over a range of about 0.6 eV to about 3.5 eV.

22. A solar cell, comprising:
a substrate having a first light receiving surface and a second, opposite, surface;
n-type dopant regions and p-type dopant regions formed adjacent said second surface of said substrate;
a layer of epitaxial material formed on said second surface, wherein forming said layer of epitaxial material diffuses said n-type dopant and said p-type dopant into said substrate and into said layer of epitaxial material, said epitaxial material having a bandgap smaller than a bandgap of said substrate;
wherein n-type and p-type junctions are formed in said substrate and in said layer of epitaxial material; and
means for collecting current from at least some junctions in said substrate material and from at least some junctions in said layer of epitaxial material.

23. The solar cell of claim 22, wherein said junctions are formed substantially simultaneously in said substrate and in said layer of epitaxial material.

24. The solar cell of claim 22, wherein said substrate is Si.

25. The solar cell of claim 22, wherein said substrate is high resistivity n-type Si.

26. The solar cell of claim 22, wherein said layer of epitaxial material is Si—Ge.

27. The solar cell of claim 22, wherein said layer of epitaxial material is Si—Ge, and further including a cap layer of Si material formed over said layer of epitaxial material.

28. The solar cell of claim 22, wherein said layer of epitaxial material is Si.

29. The solar cell of claim 22, wherein said solar cell exhibits an open circuit Voc of about 0.6 V.

30. The solar cell of claim 22, wherein said solar cell absorbs substantial photon energy over a range of about 0.6 eV to at least 1.1 eV.

31. The solar cell of claim 22, wherein said solar cell absorbs substantial photon energy over a range of about 0.6 eV to about 3.5 eV.

* * * * *